(12) United States Patent
Metzger et al.

(10) Patent No.: US 6,594,604 B2
(45) Date of Patent: Jul. 15, 2003

(54) S-PARAMETER MEASUREMENT SYSTEM FOR WIDEBAND NON-LINEAR NETWORKS

(75) Inventors: Donald M. Metzger, Colorado Springs, CO (US); David B. Marshall, Colorado Springs, CO (US); Curtis C. Hainds, Colorado Springs, CO (US)

(73) Assignee: Credence Systems Corporation, Fremont, CA (US)

( * ) Notice: Subject to any disclaimer, the term of this patent is extended or adjusted under 35 U.S.C. 154(b) by 44 days.

(21) Appl. No.: 09/783,912

(22) Filed: Feb. 14, 2001

(65) Prior Publication Data

US 2001/0004729 A1 Jun. 21, 2001

Related U.S. Application Data

(63) Continuation-in-part of application No. 09/419,012, filed on Oct. 13, 1999.

(51) Int. Cl.[7] .............................................. G01C 19/00
(52) U.S. Cl. ...................................................... 702/104
(58) Field of Search .......................... 702/104; 324/613, 324/638; 330/277; 333/28; 455/619, 506; 703/13; 395/500

(56) References Cited

U.S. PATENT DOCUMENTS

| | | | | |
|---|---|---|---|---|
| 3,794,936 A | * | 2/1974 | Poschenreieder et al. | 333/28 |
| 4,401,952 A | * | 8/1983 | Basawapatna | 330/277 |
| 5,010,588 A | * | 4/1991 | Gimlett | 455/619 |
| 5,072,189 A | * | 12/1991 | Openlander | 324/638 |
| 5,191,294 A | * | 3/1993 | Grace et al. | 324/613 |
| 6,088,523 A | * | 7/2000 | Nabors et al. | 395/500.35 |
| 6,106,563 A | * | 8/2000 | Stengel et al. | 703/13 |
| 6,272,350 B1 | * | 8/2001 | Tekinay | 455/506 |

* cited by examiner

*Primary Examiner*—John Barlow
*Assistant Examiner*—Tung S Lau
(74) *Attorney, Agent, or Firm*—Daniel J. Bedell; Smith-Hill and Bedell

(57) ABSTRACT

A system for determining scattering parameters (S-parameters) characterizing the behavior of a network applies a wideband stimulus signal containing multiple signal components as input to the network. The system then measures incident and reflected waveforms at all of the network's ports, digitizes and converts the measured waveforms from time domain to frequency domain data, and then computes the S-parameters values for each frequency component of interest from the frequency domain data for that frequency. The system also determines its own error coefficients (E-coefficients) for each frequency of interest from data collected during a sequence of measurements in response to either a sinusoid or a wideband signal and adjusts the computed S-parameter values accordingly.

25 Claims, 7 Drawing Sheets

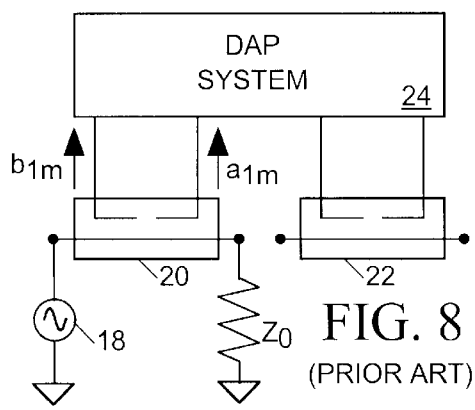
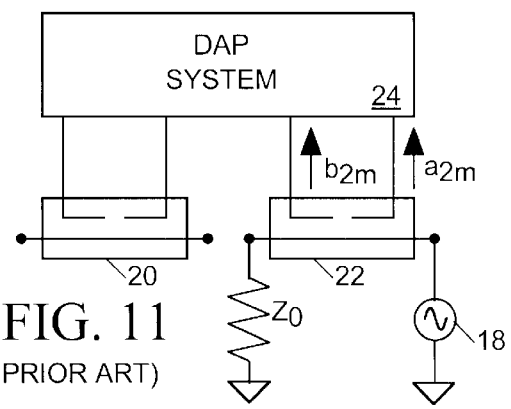
FIG. 8 (PRIOR ART)   FIG. 11 (PRIOR ART)
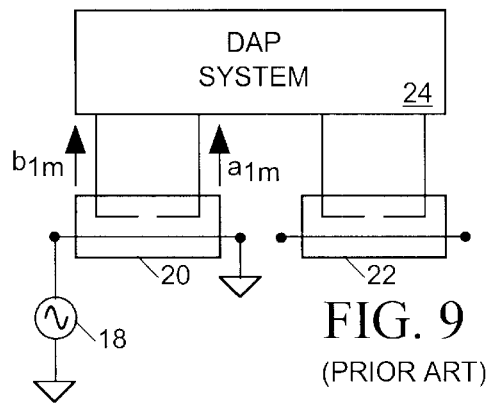
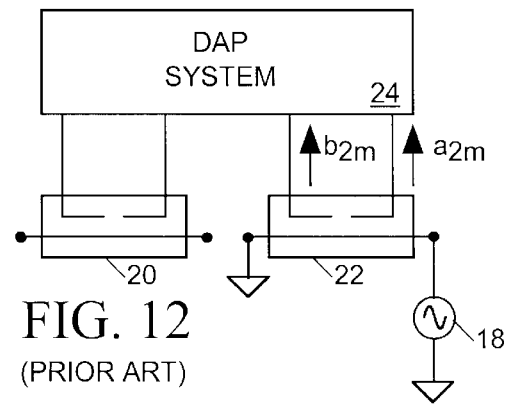
FIG. 9 (PRIOR ART)   FIG. 12 (PRIOR ART)
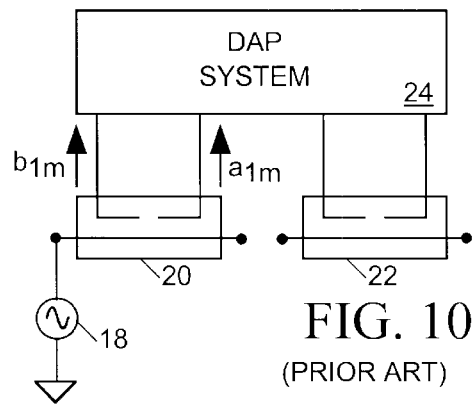
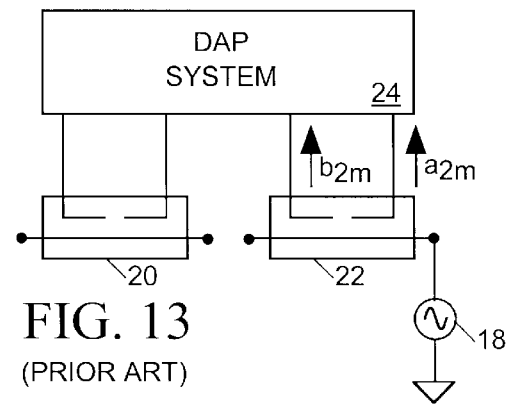
FIG. 10 (PRIOR ART)   FIG. 13 (PRIOR ART)
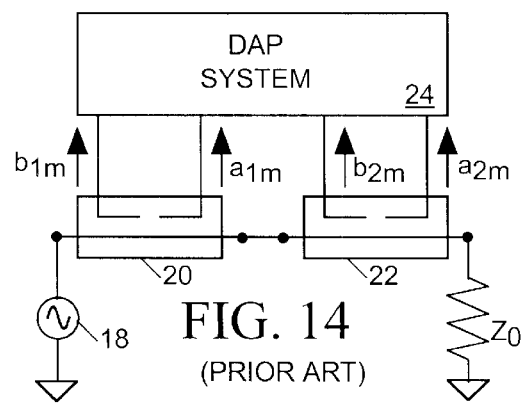
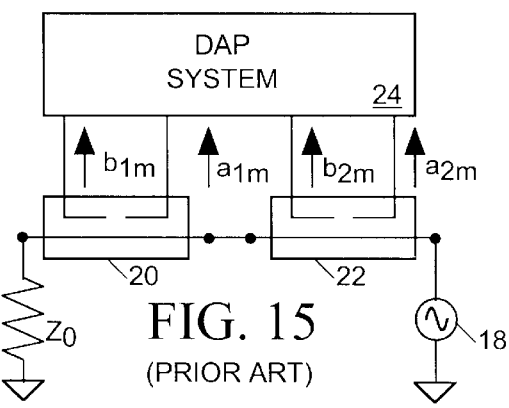
FIG. 14 (PRIOR ART)   FIG. 15 (PRIOR ART)

S-PARAMETER MEASUREMENT SYSTEM FOR WIDEBAND NON-LINEAR NETWORKS

CROSS-REFERENCE TO RELATED APPLICATIONS

The present application is a continuation-in-part of copending U.S. application Ser. No. 09/419,012 entitled "Method of Characterizing a Device Under Test," filed Oct. 13, 1999.

BACKGROUND OF THE INVENTION

1. Field of the Invention

The present invention relates in general to systems for measuring scattering parameters ("S-parameters") of an electronic network having wideband input and output signals, and in particular to a system for measuring S-parameters of a non-linear, wideband network.

2. Description of Related Art

S-parameter Modeling

Figure 1:
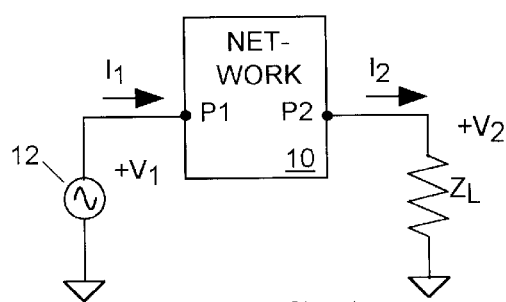

FIG. 1 is a simple block diagram of a two-port active or passive electronic network 10 such as an amplifier or a filter supplying an output signal of current $I_2$ and voltage $V_2$ to a load of impedance $Z_L$ at its output port (P2) in response to a sine wave input signal of current $I_1$ and voltage $V_1$ supplied to its input port (P1) from a signal source 12. Port P1 can reflect a portion of that input signal back towards its source 12 depending on the amount of mismatch between the output impedance of signal source 12 and the network's input impedance. The reflected signal's amplitude increases with the impedance mismatch, and when the network's input impedance perfectly matches the signal source's output impedance there will be no reflection at all. Similarly, load impedance $Z_L$ will reflect some portion of the network's output signal back towards port P2 depending on how well the network's output impedance matches the load impedance. Amplifier 10 will also feed back some of the reflected load signal to port P1, a process known as "reverse gain".

A circuit designer normally doesn't want any signal reflections because they impede power transfer in the output signal. To reduce reflections, the designer usually tries to design a multi-port network so that its input impedances match the expected output impedances of the circuits that are to supply its input signals, and so that the network's output impedances match the impedances of its anticipated loads. For high frequency applications, designers typically design circuit components so that they each have a standard input/output impedance, usually called "$Z_0$". 50 Ohms is a commonly employed impedance standard for radio frequency circuits.

Thus when designing a network such as an amplifier, a circuit designer wants not only to be able to predict the network's forward gain, but also wants to predict how much of its input and output signals will be reflected when the network is operating in a standard $Z_0$ impedance environment. The designer will also want to know the network's reverse gain.

Figure 2:
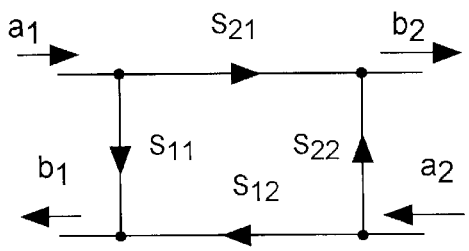

Circuit designers often use a scattering parameter ("S-parameter") model to describe the behavior of a two-port or multi-port network. FIG. 2 is a conventional S-parameter model of the two-port network 1 of FIG. 1. The model is called a "scattering parameter" (S-parameter) model because it takes into account signal reflections (scattering) of the network's input and output signals. The S-parameter model represents the incoming and reflected signals at port P1 by waveform parameters $a_1$ and $b_1$, represents the outgoing signal at port P2 by a waveform parameter $b_2$ and represents the signal reflected from the load back toward the port P2 as a waveform parameter $a_2$. The following four relations define the $a_1$, $b_1$, $a_2$ and $b_2$ parameters in terms of the network's input and output voltages and currents:

$$a_1 = (V_1 + Z_0 I_1)/2(Z_0)^{1/2} \quad [1]$$

$$b_1 = (V_1 - Z_0 I_1)/2(Z_0)^{1/2} \quad [2]$$

$$a_2 = (V_2 + Z_0 I_2)/2(Z_0)^{1/2} \quad [3]$$

$$b_2 = (V_2 - Z_0 I_2)/2(Z_0)^{1/2} \quad [4]$$

The network model includes a set of S-parameters $S_{11}$, $S_{21}$, $S_{12}$ and $S_{22}$ representing the behavior of the network. The input reflection coefficient $S_{11}$, a function of the network's input impedance, models how the network reflects the input signal in an $Z_0$ environment. When the network's input impedance matches $Z_0$, the $S_{11}$ parameter will be 0. The $S_{21}$ parameter is the insertion gain of the network when it is operating in a $Z_0$ environment. An "output reflection coefficient" $S_{22}$, a measure of signal reflection at port P2, is a function of the network's output impedance in relation to $Z_0$. $S_{22}$ has zero value when the network's output impedance matches $Z_0$. The $S_{12}$ parameter is a measure of the network's reverse gain. The S-parameter model relates the $a_1$, $b_1$, $a_2$, and $b_2$ waveforms to the $S_{11}$, $S_{12}$, $S_{21}$, and $S_{22}$ S-parameters as follows:

$$b_1 = S_{11} a_1 + S_{12} a_2 \quad [5]$$

$$b_2 = S_{21} a_1 + S_{22} a_2 \quad [6]$$

S-parameter Measurement

When the expected performance of a network design is specified in terms of the S-parameter model, a designer can use readily available computer-aided design tools to compute the S-parameters of a network design to determine how well the design meets its S-parameter specifications. After the network is fabricated, a test engineer would like to be able to measure the network's actual S-parameter values to determine whether the network meets those specifications. Since the S-parameters are an abstraction the test engineer cannot measure them directly, but he or she can compute them from signal measurements made at the network's input and output terminals as it drives a $Z_0$ load in response to an input sine wave signal produced by a signal source having a $Z_0$ output impedance.

Figure 3:
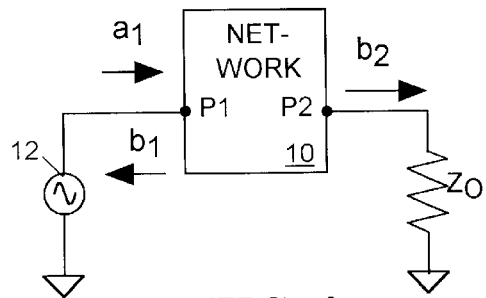
Figure 4:
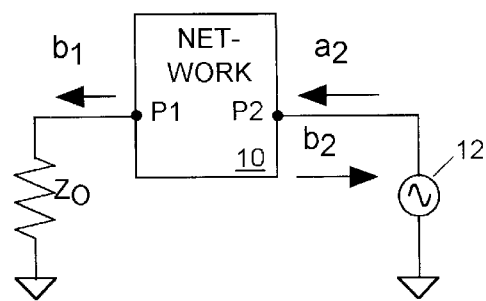

FIGS. 3 and 4 illustrate one way to measure the S-parameters of network 10 of FIG. 1. With port P2 terminated with the network's characteristic impedance $Z_0$ and source 12 driving port P1 as illustrated in FIG. 3, there will be no incident wave $a_2$ at port P2 because there will be no reflection at the load. With $a_2$ equal to 0, equations [5] and [6] reduce to:

$$b_1 = S_{11} a_1 \quad [7]$$

$$b_2 = S_{21} a_1 \quad [8]$$

By measuring the $a_1$, $b_1$, and $b_2$ waves, with the test configuration of network 10 we can solve equations [7] and [8] to compute the $S_{11}$ and $S_{21}$ parameters.

We then terminate port P1 with characteristic impedance $Z_0$ so that there is no incident wave $a_1$ at that port and use signal generator 12 to stimulate port P2. With $a_1$ equal to 0, equations [5] and [6] reduce to:

$$b_1 = S_{12} a_2 \quad [9]$$

$$b_2 = S_{22} a_2 \quad [10]$$

Thus by measuring the $a_2$, $b_1$, and $b_2$ waves, with the test configuration of network 10 we can solve equations [9] and [10] to compute the $S_{12}$ and $S_{22}$ parameters.

Error Correction

Unfortunately the S-parameter measurement approach described above is not highly accurate because it does not account for errors resulting from the influences of the internal impedances of the test system that must be connected to network 10 when measuring $a_1$, $a_2$, $b_1$ and $b_2$.

Figure 5A:
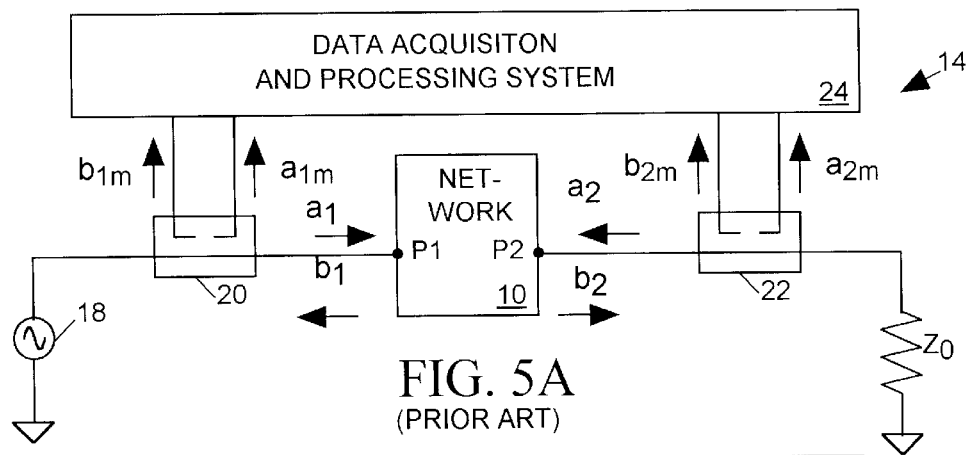
Figure 5B:
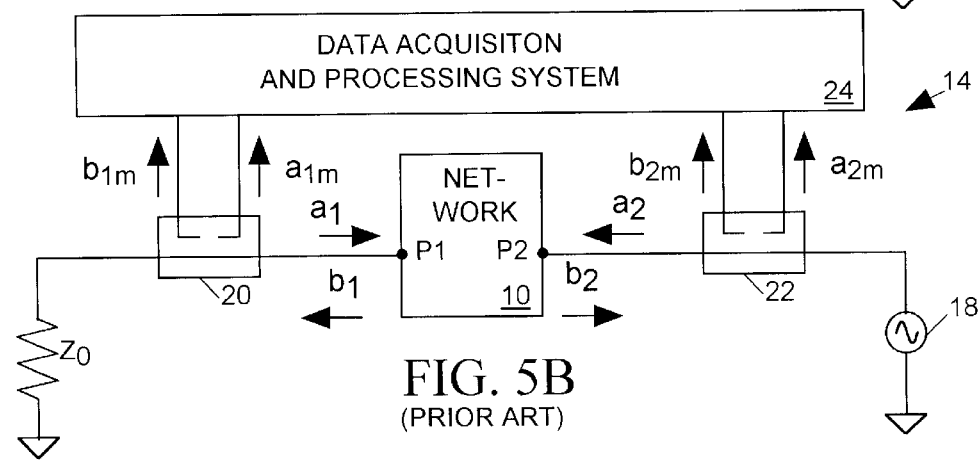

FIGS. 5A and 5B depict a test system 14 typically used to measure the $a_1$, $a_2$, $b_1$ and $b_2$ values needed to determine the S-parameters of a two-port (network) network under test 16. FIG. 5A shows the test system 14 configured to make the forward measurement depicted in FIG. 3 and FIG. 5B shows test system 14 configured to make the reverse measurement depicted in FIG. 4. Test system 14 includes a signal generator 18 supplying a single-frequency test sine wave signal to the network's port P1 and a load impedance $Z_0$ connected to port P2. A directional coupler 20 senses the incident and reflected signals at port P1 and delivers voltage waveforms $a_{1m}$ and $b_{1m}$ to a data acquisition and processing (DAP) system 24. A similar directional coupler 22 senses the output and reflected signals at port P2 and delivers to DAP 24 voltage waveforms $b_{2m}$ and $a_{2m}$.

The $a_{1m}$, $b_{1m}$ $a_2$ and $b_2$ waveforms DAP system 24 senses are not directly proportional to the $a_1$, $b_1$, $a_2$ and $b_2$ waveforms appearing at ports P1 and P2 because directional couplers 20 and 22 have impedances that alter the incident and reflected waves and that can cause additional signal reflections. Systematic errors result from signal leakages due to directivity (D) and cross-talk (X), from source (S) and load (L) impedance mismatches, and from frequency response errors caused by reflection (R) and transmission tracking (T) within DAP system 24.

Figure 6:
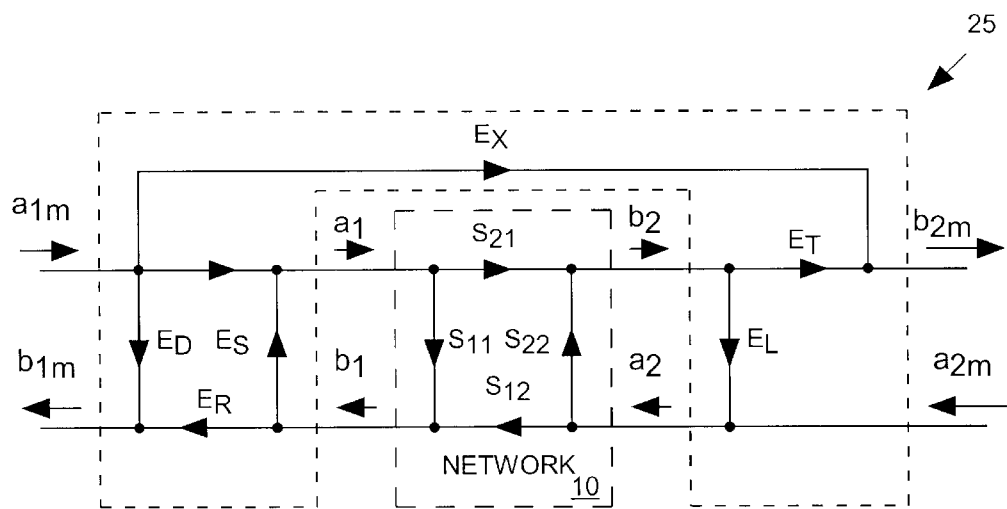
Figure 7:
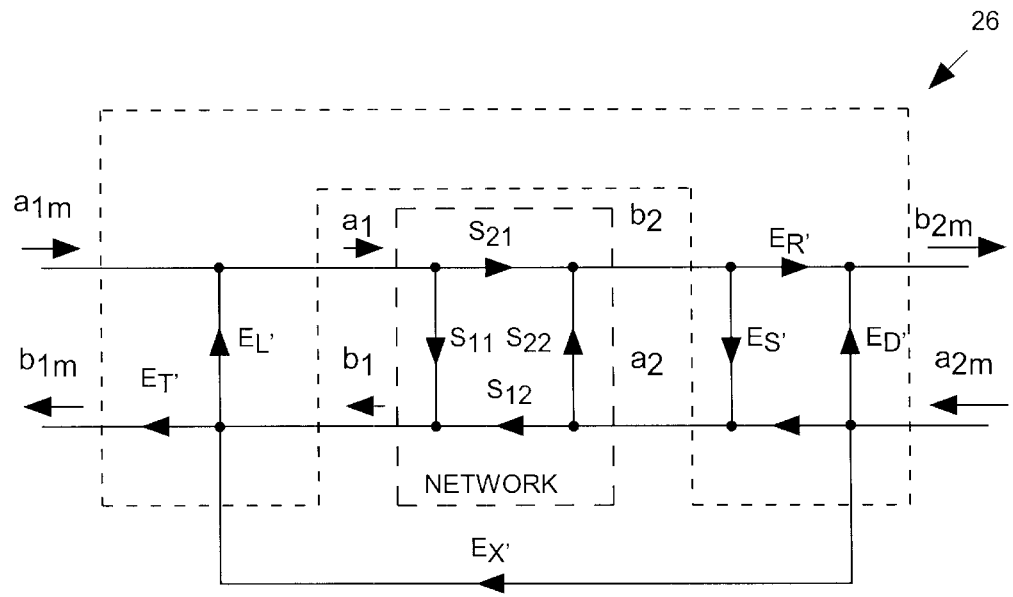

FIG. 6 models test system 14 of FIG. 5A when it is making a "forward measurement" of network 10 with signal generator 18 driving port P1 as in FIG. 3. FIG. 7 models test system 14 of FIG. 5B when it is making a "reverse measurement" of network 10 with signal generator 18 driving port P2 as in FIG. 4. In addition to the $S_{11}$, $S_{12}$, $S_{21}$ and $S_{22}$ S-parameters modeling network 10, the model of FIG. 6 includes a set of six "error parameters" (E-parameters) $E_D$, $E_S$, $E_R$, $E_T$, $E_L$, and $E_X$, each modeling a separate one of the six sources of test system error during forward measurements. Similarly FIG. 7 includes six additional E-parameters $E_{D'}$, $E_{S'}$, $E_{R'}$, $E_{T'}$, $E_{L'}$, and $E_{X'}$, each modeling a separate source of test system error during reverse measurements.

To more accurately determine the values of the network's S-parameters, DAP system 24 must first determine the values of its own E-parameters and then account for the influence of those E-parameters when computing S-parameters based on the forward and reverse measurements. It is therefore customary to perform a set of calibration measurements of the $a_{1m}$, $b_{1m}$, $a_{2m}$ and $b_{2m}$ parameters from which all 12 E-parameter values are computed. With the values of the E-parameters known, the network's actual S-parameter values can be computed from the E-parameter values and uncorrected S-parameter values determined when network 10 is thereafter tested as discussed above in connection with in FIGS. 3 and 4. Formulas for such computations are well-known. See for example, the document "Applying Error Correction to Network Analyzer Measurement", Hewlett Packard Application Note 1287-3 published in 1997, incorporated herein by reference.

FIGS. 8–15 depict test setups for a series of eight calibration measurements that are typically used to determine the forward and reverse E-parameters. In the tests of FIGS. 8–10, signal generator 18 supplies a stimulus to the input port of directional coupler 20 while its output port is terminated through $Z_0$ (FIG. 8), shorted to ground (FIG. 9) or open-circuited (FIG. 10). It is well-known that values of error parameters $E_D$, $E_S$ and $E_R$ of FIG. 6 can be computed from measurements of $a_{1m}$ and $b_{2m}$ DAP system 24 makes during those three tests. FIGS. 11–13 illustrate a similar set of tests carried out on directional coupler 22. Values of error parameters $E_{D'}$, $E_{S'}$ and $E_{R'}$ of FIG. 7 are computed from measurements of $a_{2m}$ and $b_{2m}$ DAP system 24 makes during those three tests. In the test setups of FIGS. 14 and 15, the two directional couplers 20 and 22 are interconnected. In FIG. 14 source 18 sends an a sine wave signal to directional coupler 20 while a port of directional coupler 22 is terminated by $Z_0$. In FIG. 15 source 18 sends the sine wave signal to directional coupler 22 while a port of directional coupler 20 is terminated by $Z_0$. The remaining E-parameters of FIGS. 6 and 7 can then be computed from the known values of $E_D$, $E_S$, $E_R$, $E_{D'}$, $E_{S'}$ and $E_{R'}$ and the measured values of $a_{1m}$, $b_{1m}$, $a_{2m}$ and $b_{2m}$ waveform measurements acquired during the tests illustrated in FIGS. 14 and 15.

Thus in order to determine the S-parameter values of network 10, is it customary to carry out the following steps:

1. make a series of calibration measurements as illustrated in FIGS. 8–15 to first determine the E-parameter values,
2. compute the E-parameter values for the test system,
3. perform forward and reverse tests of the network 10,
4. calculate uncorrected S-parameter values for the network based on the forward and reverse tests, and
5. apply error correction formulas to produced error corrected S-parameter values based on the computed E-parameter and uncorrected S-parameter values.

S-Parameter Measurement for Non-linear, Wideband Networks

A network's S-parameters are functions of input signal frequency because a network's forward and reverse gains and the reflections at its input and output ports are functions of input signal frequency. The test system's E-parameter values are also functions of input signal frequency. Hence all of the test and calibration configurations of FIGS. 3, 4 and 8–15 employ a signal source 18 generating the same single frequency sine wave output signal. When the network 10 is expected to operate with a single-frequency sine wave input signal, then the designer need only design the network to operate at that frequency and need only specify the network's S-parameters for that frequency. Thus it is necessary to determine only the values of the E-parameters and S-parameters for that particular operating frequency.

However when a network is expected to operate at several different frequencies, designers specify the network's S-parameter values for each of the several frequencies of interest. Thus when testing networks that can operate at any of several frequencies, the test engineer must determine whether the network's S-parameter values meets such specifications for each specified frequency of interest. Since the measurement system's E-parameters are also functions of signal frequency, the test engineer will have to determine the system's E-parameter values for each frequency of interest before computing the network's S-parameters. Accordingly it is customary to repeat the entire prior art E-parameter and S-parameter measurement and calculation process for each single frequency of interest.

Some networks are designed to amplify a wideband modulated input signal that is the sum of two or more components of differing frequency. Design engineers separately specify the desired S-parameter values for each frequency component and prior art S-parameter measurement systems test such networks the same way they test networks that are expected to respond separately to each of several single-frequency input signals; they simply repeat the prior art single-frequency E-parameter calibration and S-parameter measurement process for each single-frequency of interest that may be included as a component of the wideband input signal. In such case signal generator 18 is often a sweep generator capable of stepping its output signal frequency over the frequency range including all frequencies of interest. During each calibration or network test, DAP system 24 acquires waveform data at each frequency step of interest, and then computes the E-parameters and S-parameters for each frequency of interest from the data acquired while signal generator 18 was operating at that frequency.

Such an S-parameter measurement approach for a network that is to receive a wideband stimulus is valid when the network is to operate in a linear region. In a linear network, each frequency component of an output signal is a function only of an input component of the same frequency. A linear network's S-parameter are not functions of the magnitude of any input signal component. Accordingly, when we stimulate a linear network with a wideband input signal having N different frequency components, it will not only produce an output signal having N components of similar frequency, each output signal frequency component will look exactly as if the network had amplified the corresponding input signal component as a single frequency input signal rather than as one component of a wideband signal. Thus for each given frequency, a linear network will have the same S-parameter values relative to that frequency regardless of whether it is being stimulated by a single sine wave of that particular frequency or by a wideband signal having that particular frequency as just one component. The test engineer can therefore be confident that when he/she separately determines the S-parameters for each frequency of interest in the manner described above, those S-parameters vales will fairly represent the behavior of a linear network with respect to each signal component when it is stimulated with the wideband signal.

However not all networks are expected to operate as linear networks. For example cellular telephone amplifiers producing radio frequency output signals are often designed to operate at the upper limit of their linear ranges to conserve battery power. Such a cellular telephone amplifier can sometimes be driven into their non-linear operating ranges when various components of their wideband input signal happen to peak concurrently. Hence to determine how a telephone might behave under such conditions, a test engineer would like to measure amplifier S-parameters indicating not how such an amplifier responds to each individual component of a wide band signal, but indicating how the amplifier responds to each signal component of a wideband input signal that can overdrive the amplifier into its non-linear operating range.

The prior art approach of separately measuring the frequency-dependent S-parameters values for each component of interest of a network receiving a wideband input signal loses its validity when the wideband signal drives the network into its non-linear operating range. Under such circumstances, the amplitude of each frequency component can affect how the network responds to every other frequency component. The prior art "multiple single-frequency" approach to S-parameter measurement fails to produce S-parameter values accurately reflecting how a non-linear network behaves in response to a wideband signal.

BRIEF SUMMARY OF THE INVENTION

The present invention relates to a test system for measuring scattering parameters (S-parameters) characterizing the behavior of a multi-port network that is driven into a non-linear operating region by a wideband signal having components of more than one frequency.

In accordance with one aspect of the invention, the test system includes a signal generator for producing the wideband signal and a separate directional coupler corresponding to each port of the network. Each directional coupler can be configured to link its corresponding port to the signal generator or to a load. Each directional coupler senses incident and reflected waves at the corresponding network port and passes signals to a data acquisition and processing (DAP) system representing magnitudes of the sensed incident and reflected waves.

In accordance with another aspect of the invention, the test system performs a set of calibration tests on itself. During each calibration test the wideband signal generator transmits the wideband signal to the load, ground or an open circuit via each the directional couplers and via both directional couplers connected in series. During these calibration tests, the DAP system frequency translates, amplifies, filters and digitizes the waveforms produced by the directional couplers, and subjects the resulting data to discrete Fourier transformation to produce frequency domain data representing the amplitude and phase of each frequency component of each of those waveforms. The test system computes error parameter E-parameters values for each frequency component of interest from the frequency domain data relating to that frequency of interest.

In accordance with a further aspect of the invention, the test system also tests the network by applying the wideband signal to each of its ports while terminating each other port with a load. During these tests the DAP system also frequency translates, amplifies, filters and digitizes the waveforms produced by the directional couplers, and subjects the resulting data to discrete Fourier transformation to produce frequency domain data representing the amplitude and phase of each frequency component of each of those waveforms. The DAP system them computes uncorrected S-parameters for each frequency component of interest from the frequency domain data relating to that frequency of interest.

In accordance with yet another aspect of the invention, the test system computes corrected S-parameters for the network for each frequency of interest as a function of the uncorrected S-parameters and computed E-parameters for that frequency of interest.

Since the calibration and network tests are performed using the wideband signal as stimulus, rather than single-frequency signals, the test conditions for the network more closely resemble the actual conditions under which the network is expected to operate. The calculated S-parameter values for each frequency of interest thus more accurately reflect network behavior than prior art single-frequency tests, particularly when the wideband signal drives the network into a non-linear operating region.

It is accordingly an object of the invention to provide a measurement system for accurately determining the S-parameters of a network such as an amplifier that is expected to be driven into a non-linear operating region by its input signal.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

Figure 16A:
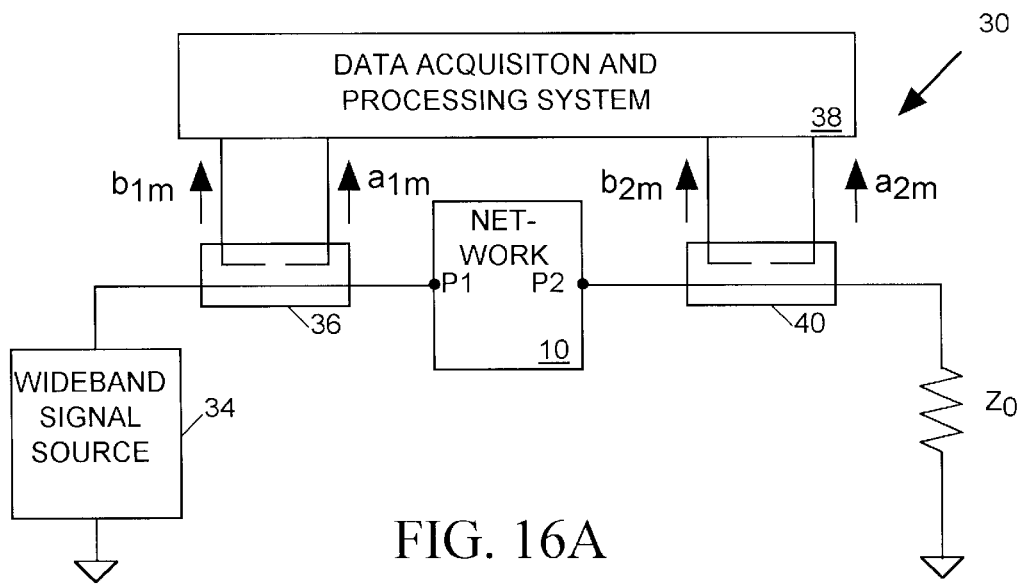
Figure 16B:
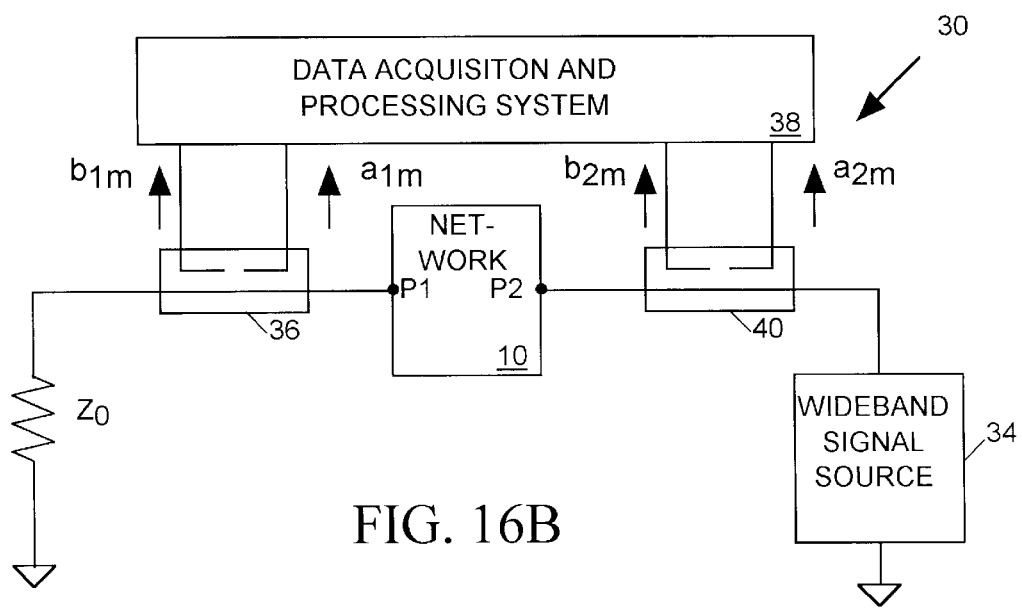
Figure 17:
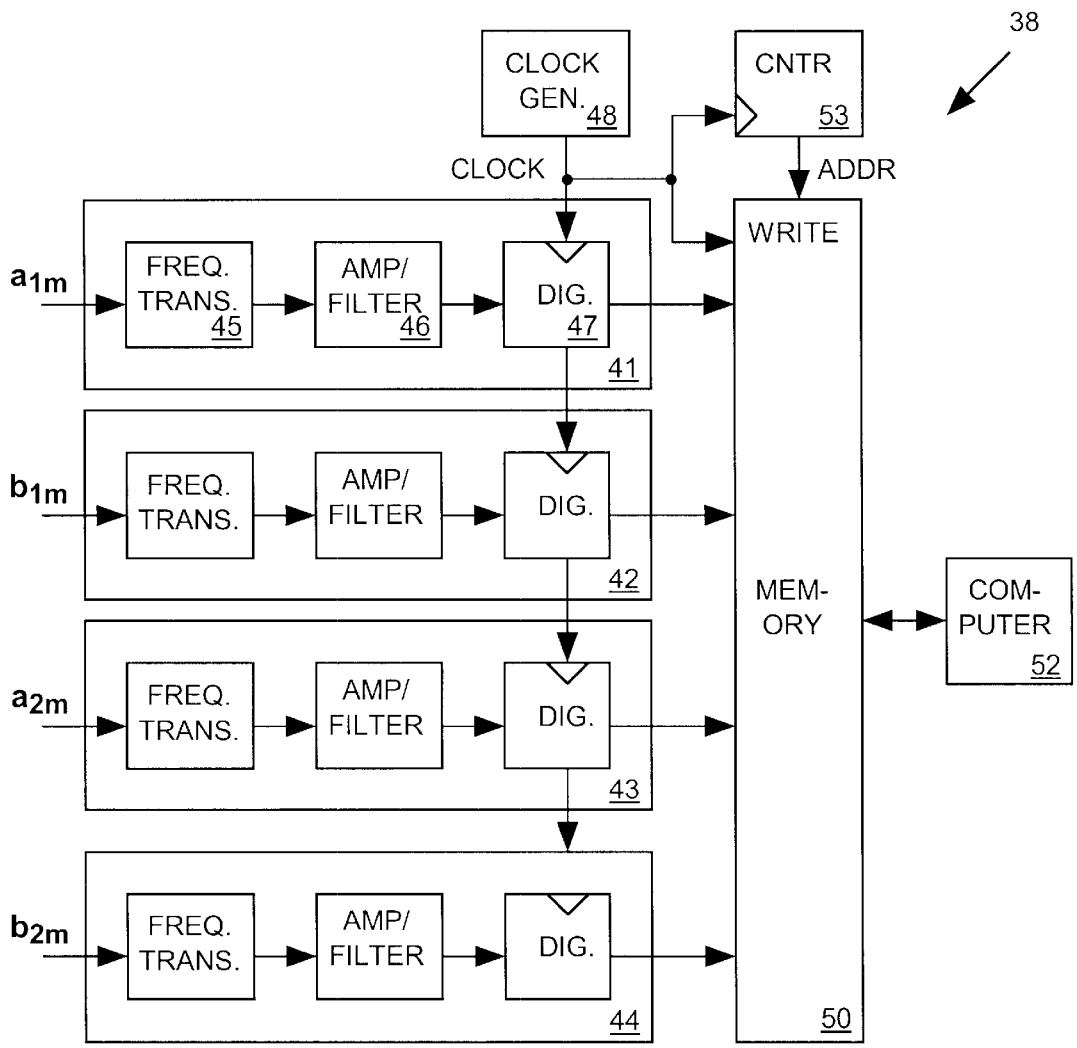
Figure 18:
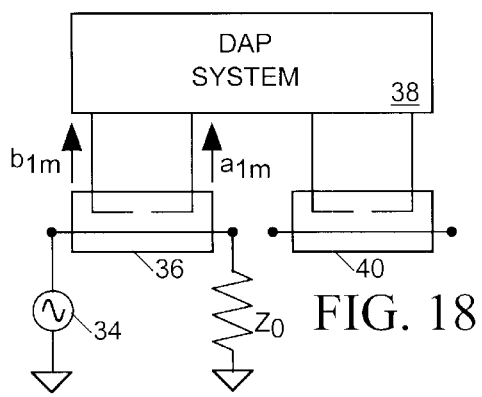
Figure 21:
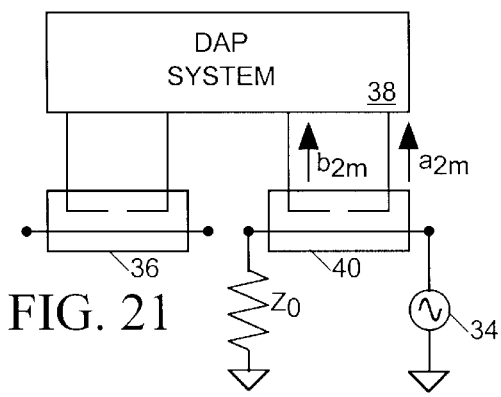
Figure 19:
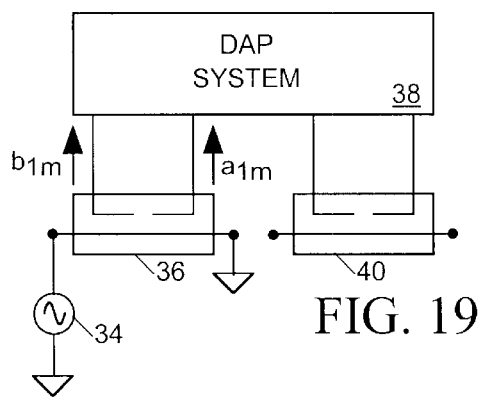
Figure 22:
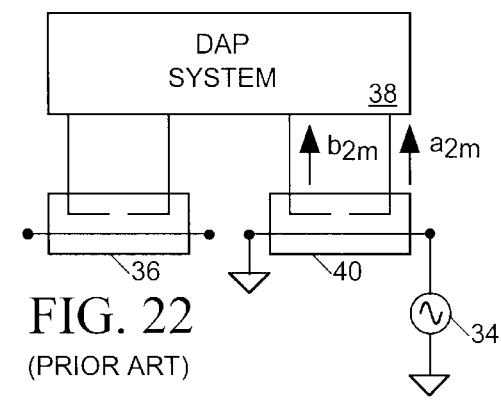
Figure 20:
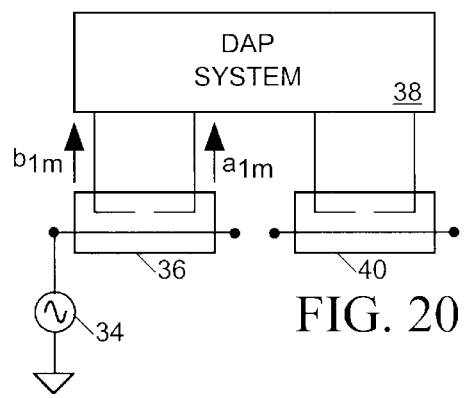
Figure 23:
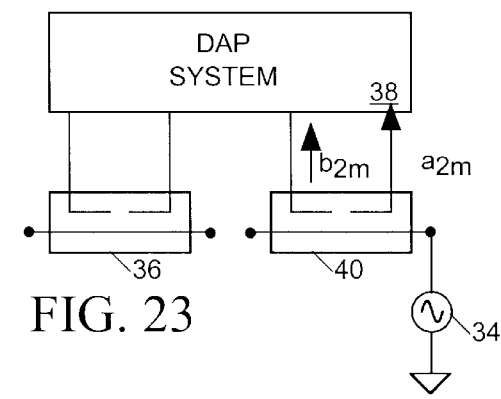
Figure 24:
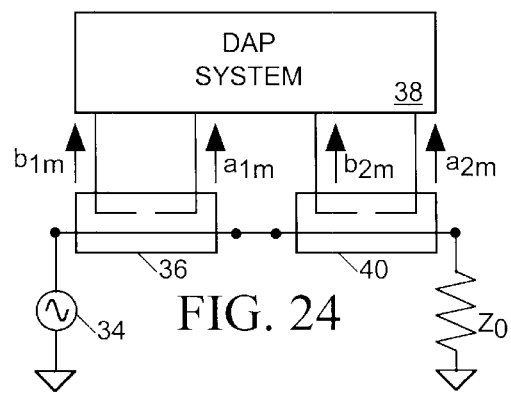
Figure 25:
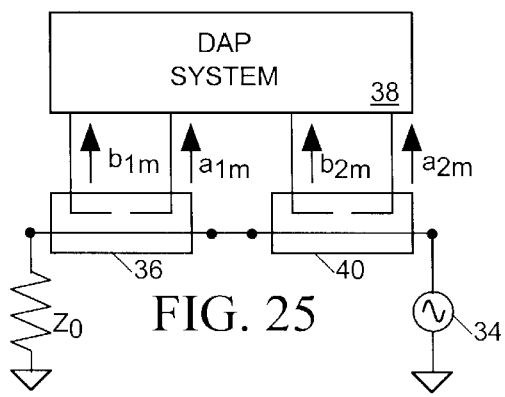
Figure 26:
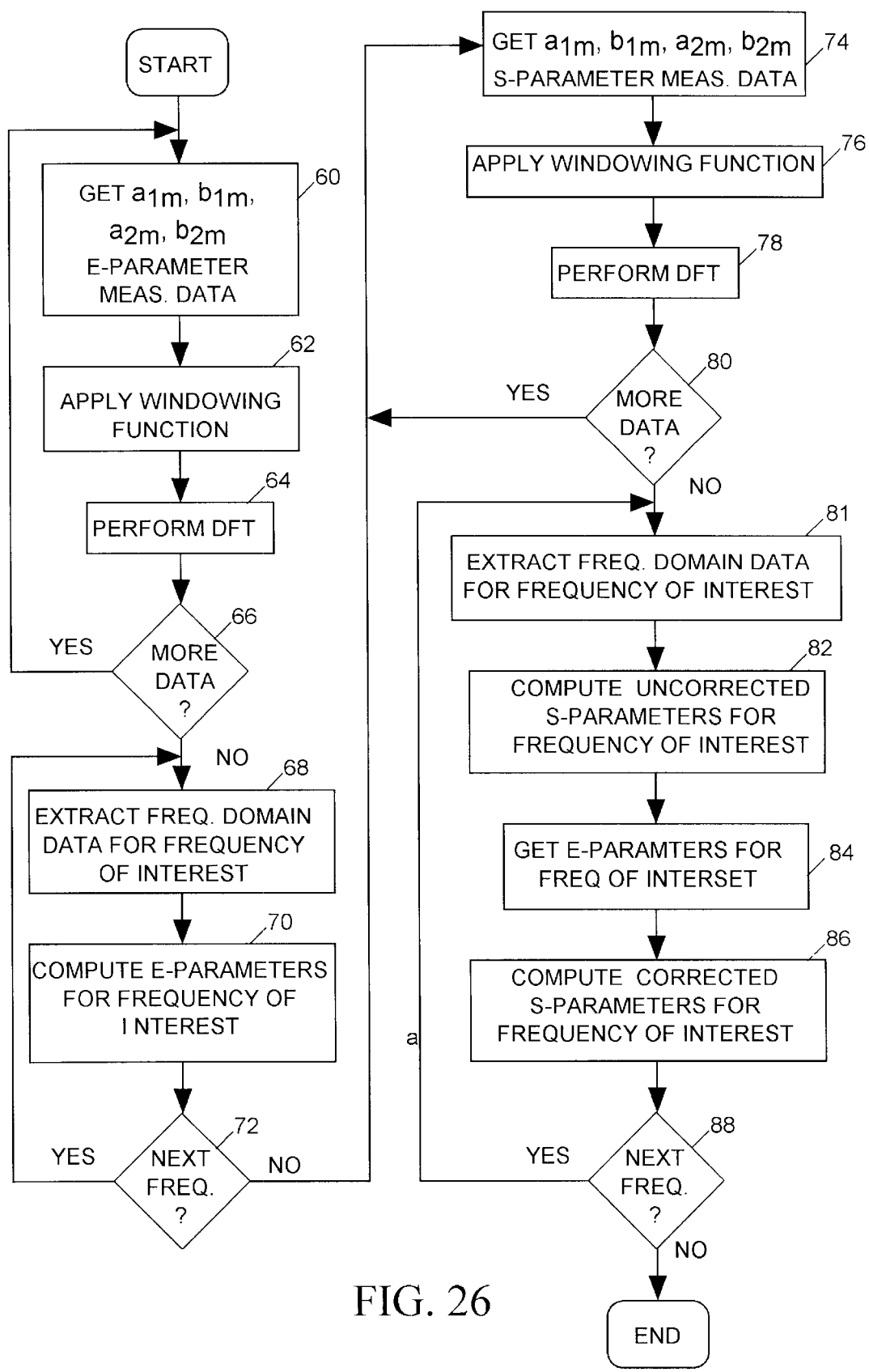

FIG. 1 depicts in block diagram form a two-port network responding to an input sine wave signal by driving an output a load, FIG. 2 depicts a prior art scattering parameter (S-parameter) model of the network of FIG. 1, FIGS. 3 and 4 each illustrate in block diagram form a manner in which the network of FIG. 1 is stimulated and terminated during forward and reverse tests performed to determine values of the S-parameters depicted in the model of FIG. 2, FIGS. 5A and 5B illustrate test system configured for performing forward and reverse S-parameter measurements on the network of FIG. 1, FIGS. 6 and 7 are scattering and error parameter model of the test system and network of FIGS. 5A and 5B during the forward and reverse tests, FIGS. 8–15 depict in block diagram form a set of six configurations for the test system of FIGS. 5A and 5B for measuring E-parameters of the test system, and FIGS. 16A and 16B illustrate a test system in accordance with the invention configured for performing forward and reverse S-parameter measurements on the network of FIG. 1, FIG. 17 illustrates the data acquisition and processing system of FIGS. 16A and 16B in more detailed block diagram form, and FIGS. 18–25 depict in block diagram form a set of six configurations for the test system of FIGS. 16A and 16B for measuring E-parameters of the test system, and FIG. 26 is a flow chart illustrating software executed by the computer of FIG. 17.

DETAILED DESCRIPTION OF THE INVENTION

Test System Architecture

FIGS. 16A and 16B illustrate a test system 30 set up for performing forward and reverse measurements, respectively, needed to determine the scattering parameters ("S-parameters") of a network 10 as it responds to a modulated, wideband signal having more than one frequency component produced by a wideband signal source 34. Test system 30 includes a directional coupler 36 linking a wideband signal source 34 to a network port P1 (or P2) and for delivering voltage waveforms $a_{1m}$ and $b_{1m}$ in response to sensed incident and reflected waveforms, respectively, to a data acquisition and processing (DAP) system 38. A similar directional coupler 40 links a load impedance $Z_0$ to network port P2 (or P1) and delivers voltage waveforms $b_{2m}$ and $a_{2m}$, respectively proportional sensed incident and reflected signal at the load impedance.

Suppose network 10 is a cellular telephone amplifier designed to amplify a wideband signal having many voice frequency components (e.g. in the range of 20 to 20,000 Hz) superimposed on a radio frequency carrier. Suppose also that when the various frequency components of the wideband input signal happen to peak in amplitude at the same time, they overdrive the amplifier so that it operates in a non-linear range. Test system 30 can measure the S-parameters of such an amplifier which enables us to determine how much network 10 will amplify and distort each of the various voice frequency components of its input signal. In particular, test system 30 provides us with an accurate S-parameter model of network 10 for each frequency component of interest.

At the level of detail illustrated in FIGS. 16A and 16B, the topology of the forward and reverse test system setups is similar to those employed by prior art measurement system 14 of FIGS. 5A and 5B except for differences between signal sources 18 and 34. Test signal source 18 of FIG. 3 supplies a sine wave test signal input to network 10 having only a single frequency component. The modulated signal source 34 of FIG. 11 supplies a wideband signal having more than one sine wave component as input to network 10. There are also internal differences between DAP 24 of FIGS. 5A and 5B and DAP 38 of FIGS. 16A and 16B. DAP 24 processes the signal outputs of directional couplers 20 and 22 to determine the S-parameter values of network 10 relative to the single frequency of the test signal produced by signal source 18, whereas DAP 38 processes the signal outputs of directional couplers 36 and 40 to concurrently determine S-parameter values relative to each of several frequency components of the wideband signal output of signal source 34.

Test system 30 in accordance with the invention is better suited than prior art test system 14 of FIGS. 5A and 5B for determining S-parameters of a network that is expected to be driven into a non-linear operating range by a wideband signal. DAP 38 calculates the S-parameters based on measurements taken while network 10 is actually being driven by such a wideband signal. Prior art test system 14 can't do that because it is limited to stimulating network 10 with a single-frequency sine wave signal.

Data Acquisition and Processing System Architecture

FIG. 17 illustrates DAP 38 of FIG. 16 in more detailed block diagram form. DAP 38 includes a set of four receivers 41–44, each for receiving a separate one of the output waveforms $a_{1m}$, $b_{1m}$, $a_{2m}$ and $b_{2m}$ of directional couplers 36 and 40 of FIG. 16. Receiver 41 includes a frequency translation stage 45 for reducing the carrier frequency of the $a_{1m}$ signal, a stage 46 for amplifying and filtering the output of stage 45 to provide an input signal to a digitizer 47 clocked by a periodic clock signal from a clock signal generator 48. Digitizer 47 converts the analog output waveform of stage 46 to a digital data sequence representing that waveform. The clock signal output of clock generator 48 clocks a counter 53 addressing a memory 50 and write enables memory 50 so that it stores each word of the waveform data sequence as digitizer 47 produces it. The other receivers 42–44, similar to receiver 41, process the $b_{1m}$, $a_{2m}$ and $b_{2m}$ waveforms in a similar manner to produce waveform data sequences also stored in memory 50. A computer 52 reads the waveform data sequence out of memory 50 and processes them as described below to determine the S-parameters for each frequency component of interest of the wideband test signal.

When the system tests a cellular telephone amplifier, the frequency translation stage 45 of each receiver 41–44 reduces the waveform's radio frequency carrier to a value compatible with the sampling rate of digitizer 47. Filter/amplifier stage 46 filters out stochastic noise outside the frequency range of interest and amplifies the signal so that it is within an amplitude range suitable as input to digitizer 47. The digitizing clock signal frequency is set sufficiently higher than the highest frequency of interest in the digitizer input signal so that the digitizer's output waveform will accurately represent the input signal without aliasing any signal frequency components of interest.

E-parameter and S-parameter Data Collection

FIGS. 6 and 7 are S-parameter/E-parameter models 25 and 26 of prior art test system 14 of FIGS. 5A and 5B as it performs forward and reverse measurements, respectively, of incident and reflected signals at the ports P1 and P2 of network 10 at some frequency of interest. As discussed above, the S-parameters $S_{11}$, $S_{12}$, $S_{21}$ and $S_{22}$ of models 25 and 26 model the behavior of network 10. Error parameters ("E-parameters") $E_D$, $E_S$, $E_R$, $E_L$, $E_T$ and $E_X$ of model 25 model the behavior of test system 14 during the forward measurement, while E-parameters $E_{D'}$, $E_{S'}$, $E_{R'}$, $E_{L'}$, $E_{T'}$ and $E_{X'}$ of model 26 model the behavior of test system 14 during the reverse measurement. As discussed above, values of waveforms $a_{1m}$, $b_{1m}$, $a_{2m}$ and $b_{2m}$ DAP system 24 acquires during the forward and reverse measurements enable it to determine "uncorrected" values of the network's S-parameters $S_{11}$, $S_{12}$, $S_{21}$ and $S_{22}$ for that single frequency of interest in a well-known manner. Also as discussed above, when values of error parameters ("E-parameters") are also determined from measurements acquired during a calibration process depicted in FIGS. 18–25, the uncorrected values of the network's S-parameters can be corrected to account for the influence of error sources within test system 14.

The same S-parameter/E-parameter models 25 and 26 model the behavior measurement system 30 and network 10 of FIGS. 17A and 17B as measurement system 30 makes forward and reverse measurements, respectively, of incident and reflected signals at the ports P1 and P2 of network 10. Since the E-parameters of tester 14 and the S-parameters of network 10 are frequency dependent, the prior art test system determines the E-parameter values and S-parameters values only with respect to the single frequency of the sine wave output signal of signal generator 18. In order to determine S-parameter and E-parameter values for other frequencies of interest, the forward and reverse measurement processes illustrated in FIGS. 5A and 5B and the calibration measurement processes illustrate in FIGS. 8–15 are repeated for each signal frequency of interest.

To determine uncorrected S-parameter values for network 10, the test system 30 in accordance with the invention also performs forward and reverse tests on network 10 using test configurations illustrated in FIGS. 16A and 16B. The E-parameter/S-parameter models 25 not only apply to tester 14 of FIG. 3 as it performs forward and reverse tests on network 10, it also applies to tester 30 of FIG. 16 as it performs forward and reverse tests on network 10. However with wideband signal source 34 supplying a network input signal having components of each frequency of interest, DAP 38 is able to determine the uncorrected S-parameter values for each frequency of interest using only a single forward test and a single reverse test.

DAP system 38 also determines the E-parameters of test system 30 based on results of set of eight calibration tests illustrated in FIGS. 18–25. While the calibration test step-ups of FIGS. 18–25 are topologically similar those of FIGS. 8–15, the latter calibration tests employ either a wideband signal generator 34 producing a signal having components of several frequencies of interest or a single frequency signal generator 18 as employed in the test setups of FIGS. 8–15. A single pass through each of the set of eight E-parameter calibration tests of FIGS. 18–25 produce all of the data DAP system 38 needs to calculate the E-parameters for each of several signal frequencies of interest.

Having determined the uncorrected S-parameters for network 10 for each frequency of interest as a result of data acquired during the forward and reverse measurements of FIGS. 16A and 16B, and having determined the test system E-parameters for each frequency of interest from data acquired during calibration tests of FIGS. 18–25, DAP 38 of FIGS. 16A and 16B calculates corrected S-parameters characterizing the behavior of network 10 for each frequency of interest.

E-parameter and S-parameter Computation

FIG. 26 illustrates the processing steps computer 52 of FIG. 17 carries out when computing the S-parameters for network 10. During each of the eight E-parameter measurements setups of FIGS. 18–25, several $a_{1m}$, $b_{1m}$, $a_{2m}$ and $b_{2m}$ data sequences are acquired and stored in memory 50. Computer 52 reads one of those E-parameter measurement data sequences out of memory 50 (step 60), subjects it to a conventional windowing function to reduce the effects of input sequence truncation in a well-known manner (step 62). It then subjects the resulting sequence to a discrete Fourier transformation (DFT) algorithm to convert the waveform data sequence representing the measured signal in the time domain into a second data sequence representing the same measured signal in the frequency domain (step 64). That second data sequence indicates the relative phase and amplitude of each frequency component of the wideband measured signal. When computer has not yet applied steps 60–64 to each data sequence collected during the E-parameter measurement process (step 66), it returns to step 60 to get a next data sequence from memory 50 and then repeats steps 62 and 64 for that next data sequence.

When all of the E-parameter measurement sequences have been converted to windowed frequency domain sequences at steps 62 and 64, computer 52 is ready to compute the E-parameters for each frequency component of interest within the wideband test signal. To do so it extracts the signal amplitude and phase information for a particular frequency of interest from every one of the frequency domain data sequences produced at steps 62 and 64. That extracted set of frequency-specific E-parameter data, along with the values of calibration standards are all that computer 52 needs to compute the E-parameters for that particular frequency (step 68). The frequency-specific E-parameter data is analogous to the data prior art DAP system 24 acquires when performing the set of 8 single-frequency E-parameter calibration tests illustrated in FIGS. 8–15. Thus computations carried out by DAP system 36 of FIGS. 18–25 to determine forward and reverse E-parameter values for one frequency component of interest, are identical in nature to the well-known computations carried out by prior art DAP system 24 of FIGS. 8–15. Step 72 tells computer 52 to repeat steps 68 and 70 in order similarly compute the test system's forward and reverse E-parameters for each frequency component of interest of the stimulus signal generated by wideband signal source 34.

With the E-parameters computed for each frequency of interest, computer 52 can calculate the S-parameters of network 10 for each such frequency from the $a_{1m}$, $b_{1m}$, $a_{2m}$ and $b_{2m}$ data DAP system 38 collected, digitized and stored in memory 50 (FIG. 12) during the forward and reverse tests of test system 30 illustrated in FIGS. 16A and 16B. To do so computer 52 reads a first one of those S-parameter measurement data sequences out of memory 50 (step 74), applies a windowing function (step 76) and subjects the result to a conventional DFT algorithm (step 78) to convert the time domain waveform data sequence into a frequency domain data sequence indicating the relative phase and amplitude of each frequency component of the wideband stimulus signal. If computer 52 has not yet applied steps 76 and 78 to all four data sequences collected during the S-parameter measurement process (step 80), it returns to step 74 to get a next such data sequence from memory 50 and then repeats steps 76 and 78.

After converting all of the $a_{1m}$, $b_{1m}$, $a_{2m}$, and $b_{2m}$ data sequences acquired during forward and reverse tests into frequency domain sequences at steps 74–78, computer 52 can then determine the network's uncorrected S-parameter values for each frequency of interest. To do so it extracts the signal amplitude and phase information for that particular frequency of interest from every one of the eight frequency domain data sequences produced at steps 74–78 (step 81). Computer 52 then computes uncorrected S-parameter values for that particular frequency of interest (step 82) based on the frequency domain data obtained at step 81. Since the extracted frequency data for the particular frequency of interest is similar in nature to the data prior art DAP system 24 acquires during the forward and reverse tests illustrated in FIGS. 5A and 5B, computer 54 can use a similar well-known method for computing the uncorrected S-parameter values.

To correct the uncorrected S-parameter values to account for errors resulting from internal test system impedances, computer 54 thereafter acquires the previously computed E-parameters for that frequency of interest (step 84) and then uses those E-parameter values to adjust the uncorrected S-parameter values computed at step 82 to produce error corrected S-parameter values for the frequency of interest (step 86). The computations carried out at step 86 are described in the document "Applying Error Correction to Network Analyzer Measurement", Hewlett Packard Application Note 1287-3 published in 1997, incorporated herein by reference.

Step 88 tells computer 52 to repeat steps 81–86 to determine the S-parameters for each frequency of interest.

Thus has been shown and described a test system 30 for determining a separate S-parameter model characterizing the behavior of a network 10 in response to each of several frequency components of a wideband or modulated input signal. When the network 10 being tested is expected to be driven into a non-linear operating range by a wideband signal in its intended operating environment, a test system employing a wideband test signal in accordance with the invention can produce more accurately corrected S-parameter models for each component frequency than prior art systems that stimulate the network with only signal frequency test signals.

Multiple Port Network Applications

While the invention has been illustrated in connection with determining S-parameter models for a two-port network, the invention may also be used to develop S-parameter models for networks having one or three or more ports. The invention may be thought of as an improvement to the prior art S-parameter measurement system that stimulates the network with a single-frequency signal and derives single-frequency E-parameter and S-parameter model from measurements of incident and reflected waves at the network ports. The invention uses the same set of test and calibration configurations as prior art systems, except that it stimulates the network with wideband signals instead of single-frequency signals, and applies DFT processing to acquired waveforms to produce data representing the amplitude and phase of each frequency component of those waveforms. The present invention applies the same computations to the phase and amplitude data for each frequency of interest that prior art systems apply to their single-frequency measurement data to determine E-parameter and S-parameter values for that frequency from which corrected S-parameter values can determined. Hence those of skill in the art will understand that prior art S-parameter measurement systems that produce single-frequency S-parameter models for networks having more than two ports based on measurements of incident and reflected waves can be modified in an analogous fashion by replacing single-frequency signal sources with wideband signal sources and using DFT processing to separate out the frequency components of the acquired waveforms.

Thus while the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A method for determining values of scattering parameters (S-parameters) forming each of a plurality of models of a network, each model modeling behavior of the network relative to a separate one of a plurality of frequencies, the method comprising the steps of:

a. applying at least one wideband stimulus signal to the network such that the network produces at least one wideband response signal as output in response thereto, where each wideband stimulus signal and each wideband response signal has a plurality of signal components, each of a separate one of the plurality of frequencies;

b. generating a plurality of waveforms, each in response to a separate one of the wideband stimulus and wideband response signals, each waveform having a plurality of signal components, each of a separate one of said plurality of frequencies; and c. processing each waveform generated at step b to determine values of S-parameters forming each of said plurality of models.

2. The method in accordance with claim 1 wherein step C comprises the substeps of:

c1. processing each waveform generated at step b to produce frequency domain data representing each frequency component of each waveform; and c2. calculating values of S-parameters forming each of said plurality of models as functions of the frequency domain data produced at step c1.

3. The method in accordance with claim 2 further comprising the step of:

d. determining values of error parameters forming a plurality of error models, each error model modeling behavior relative to a separate one of the plurality of frequencies of a test apparatus carrying out steps a and b, wherein values of said S-parameters forming each of said plurality of models calculated in step c2 are also functions of values of error parameters determined at step d.

4. The method in accordance with claim 2 wherein step c1 comprises the substeps of:
   c11. digitizing each waveform to produce a corresponding waveform data sequence representing an amplitude of the waveform as a function of time; and
   c12. processing each waveform data sequence produced at step c11 to produce the frequency domain data.

5. The method in accordance with claim 4 wherein values of S-parameters forming each model modeling behavior of the network relative to a separate one of said plurality of frequencies produced at step c12 are functions of portions of the frequency domain data produced at step c12 representing phase and amplitude of frequency components only of that separate one of said plurality of frequencies.

6. The method in accordance with claim 1 wherein at least a portion of said wideband stimulus signal drives the network into a non-linear operating region at step a.

7. A method for determining values of scattering parameters (S-parameters) forming each of a plurality of models of a network, each model modeling behavior of the network relative to a separate one of a plurality of frequencies, the method comprising the steps of:
   a. employing a test apparatus to apply at least one wideband stimulus signal to the network such that the network produces at least one wideband response signal as output in response thereto, where each wideband stimulus signal and each wideband response signal has a plurality of signal components, each signal component being of a separate one of the plurality of frequencies;
   b. employing the test apparatus to generate a plurality of waveforms, each in response to a separate one of the wideband stimulus and wideband response signals, each waveform having a plurality of signal components, each of a separate one of said plurality of frequencies;
   c. determining a plurality of error parameter values forming a plurality of error models, each error model corresponding to a separate one of said plurality of frequencies, each error model characterizing a manner in which the test apparatus influences signal components of the error model's corresponding frequency of the waveforms the test apparatus generates at step b;
   d. processing each waveform generated at step b to produce frequency domain data representing the frequency components of each waveform; and
   e. calculating values of S-parameters forming each of said plurality of models as functions of the frequency domain data produced at step d and error parameter values determined as step c.

8. The method in accordance with claim 7 wherein step d comprises the substeps of:
   d1. digitizing each waveform to produce a corresponding waveform data sequence representing an amplitude of the waveform as a function of time; and
   d2. processing each waveform data sequence produced at step d1 to produce said frequency domain data.

9. The method in accordance with claim 8 wherein values of S-parameters forming each model modeling behavior of the network relative to a separate one of said plurality of frequencies are calculated at step e as functions of portions of the frequency domain data produced at step d2 representing frequency components only of that separate one of said plurality of frequencies and of E-parameters determined at step c forming an error model corresponding only to that separate one of said plurality of frequencies.

10. The method in accordance with claim 7 wherein at least a portion of said wideband stimulus signal drives the network into a non-linear operating region at step a.

11. An apparatus for determining values of scattering parameters (S-parameters) forming each of a plurality of models of a network, each model modeling behavior of the network relative to a separate one of a plurality of frequencies, the apparatus comprising:
   first means for applying at least one wideband stimulus signal to the network such that the network produces at least one wideband response signal as output in response thereto, where each wideband stimulus signal and each wideband response signal has a plurality of signal components, each of a separate one of the plurality of frequencies, and for generating a plurality of waveforms, each in response to a separate one of the wideband stimulus and wideband response signals, each waveform having a plurality of signal components, each of a separate one of said plurality of frequencies; and
   second means for processing each waveform generated by said first means to determine values of S-parameters forming each of said plurality of models.

12. The apparatus in accordance with claim 11 wherein said second means comprises:
   third means for processing each waveform generated by said first means to produce frequency domain data representing each frequency component of each waveform; and
   fourth means for calculating values of S-parameters forming each of said plurality of models as functions of the frequency domain data produced by said third means.

13. The apparatus in accordance with claim 12 wherein said fourth means calculates values of said S-parameters as functions of the frequency domain data produced by said third means and of values of error parameters modeling a manner in which internal impedances of said first means influence the waveforms generated by the first means.

14. The apparatus in accordance with claim 12 wherein said third means comprises:
   fifth means for digitizing each waveform to produce a corresponding waveform data sequence representing an amplitude of the waveform as a function of time; and
   sixth means processing each waveform data sequence to produce the frequency domain data.

15. The apparatus in accordance with claim 14 wherein values of S-parameters forming each model modeling behavior of the network relative to a separate one of said plurality of frequencies are functions of portions of the frequency domain data representing phase and amplitude of frequency components only of that separate one of said plurality of frequencies.

16. The apparatus in accordance with claim 11 wherein at least a portion of said wideband stimulus signal drives the network into a non-linear operating region.

17. An apparatus for determining values of scattering parameters (S-parameters) forming each of a plurality of models of a network, each model modeling behavior of the network relative to a separate one of a plurality of frequencies, the apparatus comprising:
   first means for applying at least one wideband stimulus signal to the network such that the network produces at least one wideband response signal as output in response thereto, where each wideband stimulus signal and each wideband response signal has a plurality of signal components, each signal component being of a separate one of the plurality of frequencies and for generating a plurality of waveforms, each in response to a separate one of the wideband stimulus and wideband response signals, each waveform having a plurality of signal components, each of a separate one of said plurality of frequencies, said first means having internal impedances that influence said waveforms;

second means for processing each waveform generated by the first means to produce frequency domain data representing the frequency components of each waveform; and third means for calculating values of S-parameters forming each of said plurality of models as functions of the frequency domain data generated by said second means and of error parameter values characterizing a manner in which the internal impedances of the second means influence the waveforms it generates.

18. The apparatus in accordance with claim 17 wherein said second means comprises:

fourth means for digitizing each waveform to produce a corresponding waveform data sequence representing an amplitude of the waveform as a function of time; and fifth means for processing each waveform data sequence produced by said fourth means to produce said frequency domain data.

19. The apparatus in accordance with claim 18 wherein at least a portion of said wideband stimulus signal drives the network into a non-linear operating region.

20. A method for determining scattering parameters (S-parameters) characterizing behavior of a network having first and second ports, the method comprising the steps of:

a. terminating the network's second port with a load impedance;

b. providing a first stimulus signal having a plurality of frequency components to the network's first port such that said network produces a first response signal at its second port;

c. terminating the network's first port with the load impedance;

d. providing a second stimulus signal having said plurality of frequency components to the network's second port such that said network produces a second response signal at its first port;

e. generating a separate waveform in response to each of said first and second stimulus signals and said first and second response signals;

f. generating a plurality of data sequences, each by processing a separate waveform generated at step e; and g. calculating values of S-parameters of a plurality of S-parameter models from data included in the data sequences generated at step f, wherein each S-parameter model characterizes network behavior at a separate frequency.

21. The method in accordance with claim 20 wherein step e comprises the substeps of:

e1. converting said first waveform data sequences into second data sequences representing said waveforms in a frequency domain; and e2. processing said second waveform data sequences to produce said plurality of S-parameter models.

22. The method in accordance with claim 21 wherein step e1 comprises applying a Fourier transform function to said waveform data sequences.

23. The method in accordance with claim 20 wherein said test signal is produced by a modulated signal source.

24. A method for determining error-corrected scattering parameter values characterizing behavior of a network at each of a plurality of frequencies, the method comprising the steps of:

a. employing a test apparatus to apply a stimulus signal having components of said plurality of frequencies as input to the network and to measure incident and reflected waveforms appearing at all of the network's ports in response to said stimulus signal, each having signal components of said plurality of frequencies;

b. converting the measured waveforms to frequency domain data characterizing frequencies, amplitudes and phases of signal components of each waveform, c. computing uncorrected scattering parameters values for each of said plurality of frequencies from the frequency domain data for each frequency of a plurality of frequencies of interest; and d. computing the error-corrected S-parameter values for each of said plurality of frequencies of interest as functions of the uncorrected scattering parameter values and error parameter values characterizing a manner in which the test apparatus influences magnitudes and phases of the signal components of the measured incident and reflected waveforms.

25. The method in accordance with claim 24 wherein at least a portion of said stimulus signal drives the network into a non-linear operating region.

* * * * *